(12) United States Patent
Koo et al.

(10) Patent No.: US 6,404,001 B2
(45) Date of Patent: Jun. 11, 2002

(54) MULTILEVEL CONDUCTIVE INTERCONNECTIONS INCLUDING CAPACITOR ELECTRODES FOR INTEGRATED CIRCUIT DEVICES

(75) Inventors: Bon-Jae Koo; Ki-Nam Kim, both of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/771,448

(22) Filed: Jan. 26, 2001

Related U.S. Application Data

(62) Division of application No. 09/369,991, filed on Aug. 6, 1999, now Pat. No. 6,262,446.

(30) Foreign Application Priority Data

Aug. 7, 1998 (KR) ............................................ 98-32234

(51) Int. Cl.[7] ........................ H01L 27/108; H01L 23/48
(52) U.S. Cl. ...................... 257/296; 257/306; 257/532; 257/535; 257/758
(58) Field of Search ............................... 257/296, 306, 257/758, 776, 774, 532, 535

(56) References Cited

U.S. PATENT DOCUMENTS

| | | | |
|---|---|---|---|
| 5,358,889 A | 10/1994 | Emesh et al. | 437/60 |
| 5,361,234 A | 11/1994 | Iwasa | 365/210 |
| 5,689,126 A | 11/1997 | Takaishi | 257/306 |
| 5,879,982 A | 3/1999 | Park et al. | 438/241 |
| 5,937,321 A | 8/1999 | Beck et al. | 438/622 |

OTHER PUBLICATIONS

Fujii et al., Highly–Reliable Ferroelectric Memory Technology With Bismuth–layer Structured Thin Films (Y–1 Family), International Electron Devices Meeting, 1997, Dec. 7–10, 1997, pp. 597–600.

*Primary Examiner*—Minh Loan Tran
(74) *Attorney, Agent, or Firm*—Myers Bigel Sibley & Sajovec

(57) ABSTRACT

Conductive plugs are formed in a first insulating layer on an integrated circuit substrate. A first conductive layer, a capacitor dielectric film and a second conductive layer are formed on the first insulating layer including on the conductive plugs. The second conductive layer, the capacitor dielectric film and the first conductive layer are patterned to define capacitors, each including a portion of the first conductive layer, a portion of the capacitor dielectric film thereon and a portion of the second conductive layer thereon, and to define a plurality of first conductive layer patterns that are free of the capacitor dielectric film and the second conductive layer thereon. At least a first of the capacitors is electrically connected to a conductive plug and at least a second of the capacitors is not electrically connected to a conductive plug. A second insulating layer is formed on the first insulating layer, on the capacitors and on the first conductive patterns. The second insulating layer includes therein first contact holes that selectively expose the first conductive layer patterns. A first level interconnection is formed in the first contact holes and on the second insulating layer to electrically contact the first conductive patterns and to selectively electrically interconnect selected ones of the first conductive patterns to one another on the second insulating layer. A third insulating layer is formed on the second insulating layer and on the first level interconnection. The third insulating layer includes therein second contact holes that selectively expose the first level interconnection and selected ones of the capacitors. A second level interconnection is formed in the second contact holes and on the third insulating layer to selectively electrically interconnect the at least one of the first capacitors, to selectively electrically contact the first level interconnection and to selectively electrically interconnect selective ones of the at least a second of the capacitors to one another and to the first level interconnection.

9 Claims, 4 Drawing Sheets

MULTILEVEL CONDUCTIVE INTERCONNECTIONS INCLUDING CAPACITOR ELECTRODES FOR INTEGRATED CIRCUIT DEVICES

CROSS REFERENCE TO RELATED APPLICATION

This application is a divisional of application Ser. No. 09/369,991, filed Aug. 6, 1999, now U.S. Pat. No. 6,262, 446, entitled *Methods of Forming Multilevel Conductive Interconnections Including Capacitor Electrodes for Integrated Circuit Devices*, assigned to the assignee of the present invention, the disclosure of which is hereby incorporated herein by reference.

FIELD OF THE INVENTION

This invention relates to integrated circuit devices and fabrication methods therefor and more particularly to conductive interconnections for integrated circuit devices and fabrication methods therefor.

BACKGROUND OF THE INVENTION

Integrated circuits are widely used in consumer and commercial products. As the integration density of integrated circuit devices continues to increase, it may become desirable to increase the integration density of the conductive interconnections that are formed on an integrated circuit substrate. Moreover, it also may be desirable to provide more efficient processes for forming the high-density interconnections.

High-density interconnections are particularly desirable for integrated circuit memory devices such as integrated circuit Dynamic Random Access Memory (DRAM) devices. As is well known to those having skill in the art, an integrated circuit memory device generally includes a cell array region wherein an array of memory cells is provided, and a peripheral region that provides control and other circuits for the cell array region. In DRAM devices, data is stored by storing charge on integrated circuit capacitors. Accordingly, it may be desirable to integrate these capacitors with the high-density conductive interconnections for the integrated circuit memory device.

As also is well known to those having skill in the art, DRAM devices may use silicon dioxide, silicon nitride and/or other insulators as the dielectric film for the memory cell capacitors. It also is known to use a ferroelectric film, comprising for example barium titanate and/or other materials, instead of a conventional dielectric film. When a ferroelectric material is used for the dielectric film, a nonvolatile memory device may be produced. Thus, the ferroelectric film allows a remnant polarization to be stored in the ferroelectric material so that the memory cell can repeatedly switch between two stable polarization states by means of voltage pulses, thereby providing a non-volatile memory device.

In ferroelectric memory devices, it is known to use refractory metal such as platinum for the capacitor electrodes. Interconnections may be provided using a single level or double level interconnection process using different materials from those of the electrodes. See, for example, the publication entitled *Highly Reliable Ferroelectric Memory Technology with Bismuth Layer Structure Thin Film (Y-1 Family)* to Fuji et al., IEDM, Vol. 97, pp. 597–600, 1997, wherein a double level metal process is disclosed.

Notwithstanding these and other advances, it continues to be desirable to provide high-density, multilevel conductive interconnections for integrated circuit devices and efficient methods of fabricating the same. It is particularly desirable to provide high-density interconnections for integrated circuit memory devices such as integrated circuit memory devices that use ferroelectric capacitors, and efficient methods of fabricating the same.

SUMMARY OF THE INVENTION

It therefore is an object of the present invention to provide improved methods of forming conductive interconnections for integrated circuit devices, and interconnections so formed.

It is another object of the present invention to provide conductive interconnections for integrated circuit memory devices that can integrate capacitors therein, and methods of forming the same.

It is still another object of the present invention to provide conductive interconnections for integrated circuit memory devices that can integrate ferroelectric capacitors therein, and methods of forming the same.

These and other objects are provided, according to an embodiment of the present invention, by forming a first conductive layer, a capacitor dielectric film and a second conductive layer on a first insulating layer on an integrated circuit substrate. The second conductive layer, the capacitor dielectric film and the first conductive layer are patterned to define a plurality of capacitors, each comprising a portion of the first conductive layer, a portion of the capacitor dielectric film thereon and a portion of the second conductive layer thereon, and to define a plurality of first insulating layer patterns that are free of the capacitor dielectric film and the second conductive layer thereon. A second insulating layer is formed on the first insulating layer, on the plurality of capacitors and on the plurality of first conductive patterns. The second insulating layer includes therein a plurality of first contact holes that selectively expose the plurality of first conductive layer patterns.

A first level interconnection is formed in the plurality of first contact holes and on the second insulating layer to electrically contact the plurality of first conductive patterns. A third insulating layer is formed on the second insulating layer and on the first level interconnection. The third insulating layer includes therein a plurality of second contact holes that selectively expose the first level interconnection and selected ones of the plurality of capacitors. A second level interconnection is formed in the plurality of second contact holes and on the third insulating layer to selectively electrically contact the plurality of capacitors and to selectively electrically contact the first level interconnection. The first conductive layer, the second conductive layer, the first level interconnection and the second level interconnection preferably comprise the same material, and the capacitor dielectric film preferably comprises a ferroelectric film.

Accordingly, a multilevel interconnection may be fabricated of the same material as the ferroelectric capacitor electrodes. Moreover, formation of the ferroelectric capacitor and formation of the interconnections may be implemented in the same process chamber to thereby provide an in-situ process that can be efficient.

In preferred embodiments of methods according to the present invention, a plurality of conductive plugs are formed in a first insulating layer on an integrated circuit substrate. A first conductive layer, a capacitor dielectric film and a second conductive layer are formed on the first insulating layer including on the conductive plugs. The second conductive layer, the capacitor dielectric film and the first conductive layer are patterned to define a plurality of capacitors, each comprising a portion of the first conductive layer, a portion of the capacitor dielectric film thereon and a portion of the second conductive layer thereon, and to define a plurality of first conductive layer patterns that are free of the capacitor dielectric film and the second conductive layer thereon. At least a first of the plurality of capacitors is electrically connected to a conductive plug and at least a second of the plurality of capacitors is not electrically connected to a conductive plug.

A second insulating layer is formed on the first insulating layer, on the plurality of capacitors and on the plurality of first conductive patterns. The second insulating layer includes therein a plurality of first contact holes that selectively expose the plurality of first conductive layer patterns. A first level interconnection is formed in the plurality of first contact holes and on the second insulating layer to electrically contact the plurality of first conductive patterns and to selectively electrically interconnect selected ones of the first conductive patterns to one another on the second insulating layer.

A third insulating layer is formed on the second insulating layer and on the first level interconnection. The third insulating layer includes therein a plurality of second contact holes that selectively expose the first level interconnection and selected ones of the plurality of capacitors. A second level interconnection is formed in the plurality of second contact holes and on the third insulating layer to selectively electrically interconnect the at least one of the first capacitors, to selectively electrically contact the first level interconnection and to selectively electrically interconnect selective ones of the at least a second of the plurality of capacitors to one another and to the first level interconnection. Accordingly, by providing the second capacitors that are not electrically connected to a conductive plug, the top electrode of the capacitors may be used in a multilevel interconnection, and the capacitors also can reduce topography differences in an integrated circuit.

According to another aspect of the invention, conductive interconnections for an integrated circuit memory device are fabricated by forming a plurality of first conductive plugs in a first insulating layer on an integrated circuit substrate and forming a first conductive layer, a capacitor dielectric film and a second conductive layer on the first insulating layer including on the first conductive plugs. The second conductive layer, the capacitor dielectric film and the first conductive layer are patterned to define a plurality of capacitors, each comprising a portion of the first conductive layer, a portion of the capacitor dielectric film thereon and a portion of the second conductive layer thereon, such that at least a first of the plurality of capacitors is electrically connected to a first conductive plug and at least a second of the plurality of capacitors is not electrically connected to a first conductive plug. A second insulating layer is formed on the first insulating layer and on the plurality of capacitors. The second insulating layer includes therein a plurality of contact holes that expose the at least a first and second of the plurality of capacitors. A plurality of second conductive plugs is formed in the plurality of contact holes. Accordingly, by providing the second capacitors that are not electrically connected to a first conductive plug, the top electrode of the capacitors may be used in an interconnection, and the capacitors also can reduce topography differences in an integrated circuit.

When the integrated circuit devices are integrated circuit memory devices that include a cell array region and a peripheral region, the plurality of capacitors preferably is defined in the cell array region and in the peripheral region, each comprising a portion of the first conductive layer, a portion of the capacitor dielectric film thereon and a portion of the second conductive layer thereon. The plurality of first conductive layer patterns preferably is defined in the peripheral region, that are free of the capacitor dielectric film and the second conductive layer thereon. Thus, at least a first of the plurality of capacitors in the cell array region is electrically connected to a conductive plug and at least a second of the plurality of capacitors in the peripheral region is not electrically connected to a conductive plug. The capacitors in the peripheral region may be used as part of the multilevel conductive interconnections and also may be used to reduce topography differences between the cell array region and the peripheral region of an integrated circuit memory device.

Conductive interconnections for integrated circuit devices according to embodiments of the invention comprise a first insulating layer on an integrated circuit substrate, the first insulating layer including therein a plurality of conductive plugs. A plurality of capacitors is provided on the first insulating layer. Each capacitor comprises a first portion of the first conductive layer, a portion of the capacitor dielectric film thereon and a portion of the second conductive layer thereon. At least a first of the plurality of capacitors is electrically connected to a conductive plug and at least a second of the plurality of capacitors is not electrically connected to a conductive plug. A plurality of first conductive layer patterns is provided on the first insulating layer. The first conductive layer patterns comprise a second portion of the first conductive layer that is free of the capacitor dielectric film and the second conductive layer thereon.

A second insulating layer is provided on the first insulating layer, on the plurality of capacitors and on the plurality of first conductive patterns. The second insulating layer includes therein a plurality of first contact holes that selectively expose the plurality of first conductive layer patterns. A first level interconnection is provided in the plurality of first contact holes and on the second insulating layer, that electrically contacts the plurality of first conductive patterns and that selectively electrically interconnects selected ones of the first conductive patterns to one another on the second insulating layer.

A third insulating layer is provided on the second insulating layer and on the first level interconnection. The third insulating layer includes therein a plurality of second contact holes that selectively expose the first level interconnection and selected ones of the plurality of capacitors. A second level interconnection is provided in the plurality of second contact holes and on the third insulating layer, that selectively electrically contacts the at least one of the first capacitors, that selectively electrically contacts the first level interconnection and selectively electrically interconnects selected ones of the at least the second of the plurality of capacitors to one another and to the first level interconnection. A plurality of third contact holes also may be provided in the second insulating layer that underlies selected ones of the second contact holes and that selectively expose the first and second capacitors therein.

The first conductive layer, the second conductive layer, the first level interconnection and the second level interconnection preferably all comprise the same material, and the capacitor dielectric film preferably is a ferroelectric film. When the integrated circuit is an integrated circuit memory device including a cell array region and a peripheral region, the at least a first of the plurality of capacitors preferably is located in the cell array region and the at least a second of the plurality of capacitors preferably is located in the peripheral region. The plurality of first conductive layer patterns preferably is located in the peripheral region.

Accordingly, in the cell array region, ferroelectric capacitors are formed that are electrically connected to the underlying contact plugs. In the peripheral region, lower electrode patterns that are electrically connected to the contact plugs may be formed. Pseudo-ferroelectric capacitors, which are not electrically connected to the underlying contact plugs and are made of the same components as the ferroelectric capacitors in the cell array region, may be formed in the peripheral region. These electrode patterns and pseudo-ferroelectric capacitors may be used as conductive pads for a multilevel conductive interconnection. Since the pseudo-capacitors may be tall, step differences between the cell array region and the peripheral region may be reduced and the aspect ratio of later formed contact openings that reach thereto may be reduced.

DETAILED DESCRIPTION OF PREFERRED EMBODIMENTS

Figure 1:
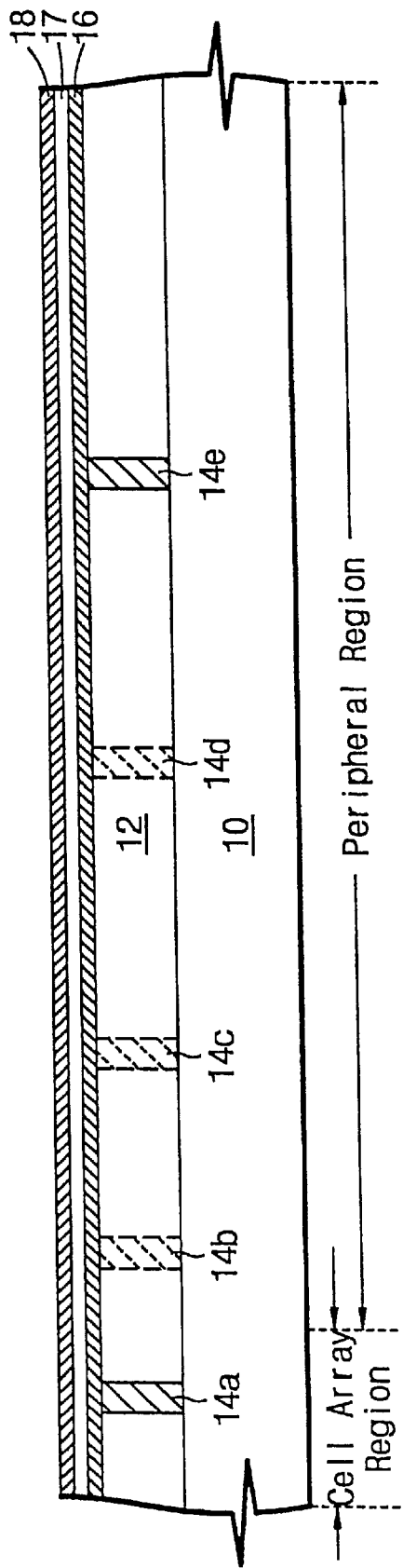
FIGS. 1–4 are cross-sectional views of integrated circuit substrates including conductive interconnections according to an embodiment of the present invention during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

FIG. 1 schematically shows a cross-section of an integrated circuit substrate such as a semiconductor substrate 10 that already has undergone several process steps according to the present invention. A cell array region and a peripheral region are defined on the semiconductor substrate 10. A first insulating layer 12, for example, comprising an oxide layer, is formed on the semiconductor substrate 10, for example by deposition. Although not shown for clarity, a conventional CMOS transistor process may be performed in the substrate 10 prior to the formation of the first insulating layer 12.

Selected portions of the first insulating layer 12 are etched to form a plurality of contact holes that expose the substrate, preferably at source/drain regions of the CMOS transistors. A conductive material is formed in the contact holes and on the first insulating layer 12, for example using a well-known Chemical Vapor Deposition (CVD) technique. The conductive material is planarized to form a plurality of contact plugs, for example, contact plugs 14a in the cell array region and contact plugs 14b to 14e on the peripheral region. The conductive material may be polysilicon, tungsten and/or copper. Other suitable conductive materials also may be used.

A lower electrode layer (first conductive layer) 16, a capacitor dielectric film 17 and an upper electrode layer (second conductive layer) 18 are sequentially formed on the substrate 10. The lower and upper electrode layers 16 and 18 may comprise material selected from the group consisting of a refractory metal, conductive oxide and a combination thereof. The refractory metal may include Pt (platinum), Ir (iridium), Ru (ruthenium), Au (gold) and/or Pd (palladium). The conductive oxide may include $IrO_2$ (iridium dioxide) and $RuO_2$ (ruthenium dioxide). The dielectric film 17 preferably comprises a ferroelectric material such as PZT, PLZT, SBT and/or BST. Other conventional materials also may be used for the lower and upper electrode layers and the capacitor dielectric films.

Figure 2:
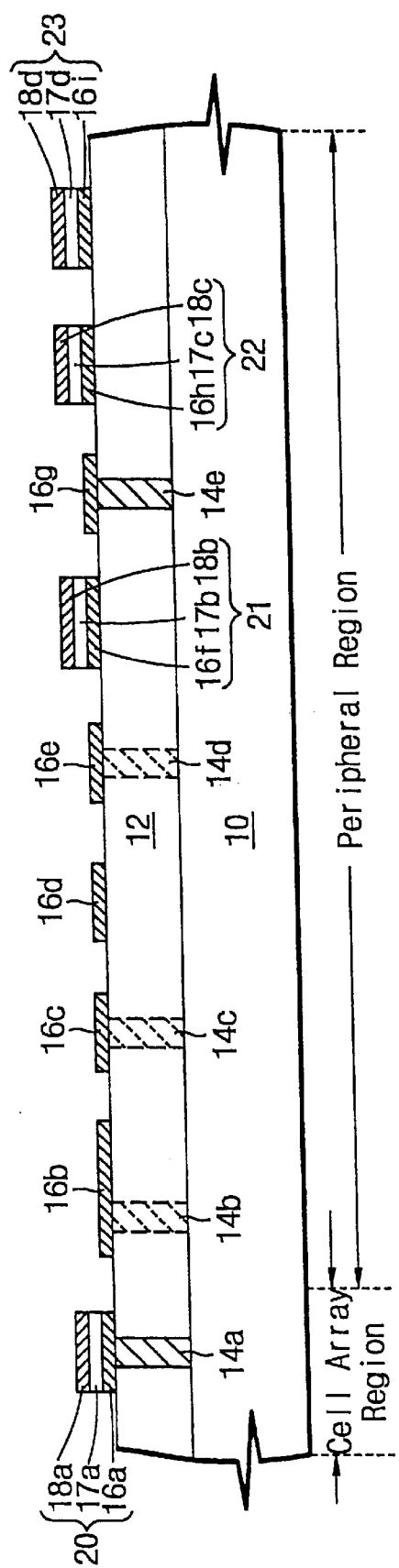

Referring now to FIG. 2, selected portions of the stacked layers 16, 17 and 18 are patterned to form predetermined patterns at the cell array region and peripheral region. More specifically, in the cell array region, a ferroelectric capacitor 20 is formed from lower electrode pattern 16a, ferroelectric film pattern 17a and upper electrode pattern 18a. The ferroelectric capacitor in the cell array region is electrically connected to the contact plug 14a.

On the other hand, in the peripheral region, lower electrode patterns 16b, 16c, 16d, 16e and 16g and pseudo-capacitors 21, 22 and 23 are formed. Although the pseudo-capacitors 21, 22 and 23 also are formed at the peripheral region, they are not electrically connected to an underlying contact plug. Therefore, these capacitor patterns 21, 22 and 23 do not serve as capacitors. However, upper electrode patterns 18b, 18c and 18d of the pseudo-capacitors 21, 22 and 23, respectively, can serve as conductive pads for later-formed interconnections. Some of the lower electrode patterns may be selectively electrically connected to the contact plugs as shown by dashed contact plugs 14b, 14c, and 14d and by the solid contact plug 14e. These lower electrode patterns also can serve as conductive pads.

Figure 3:
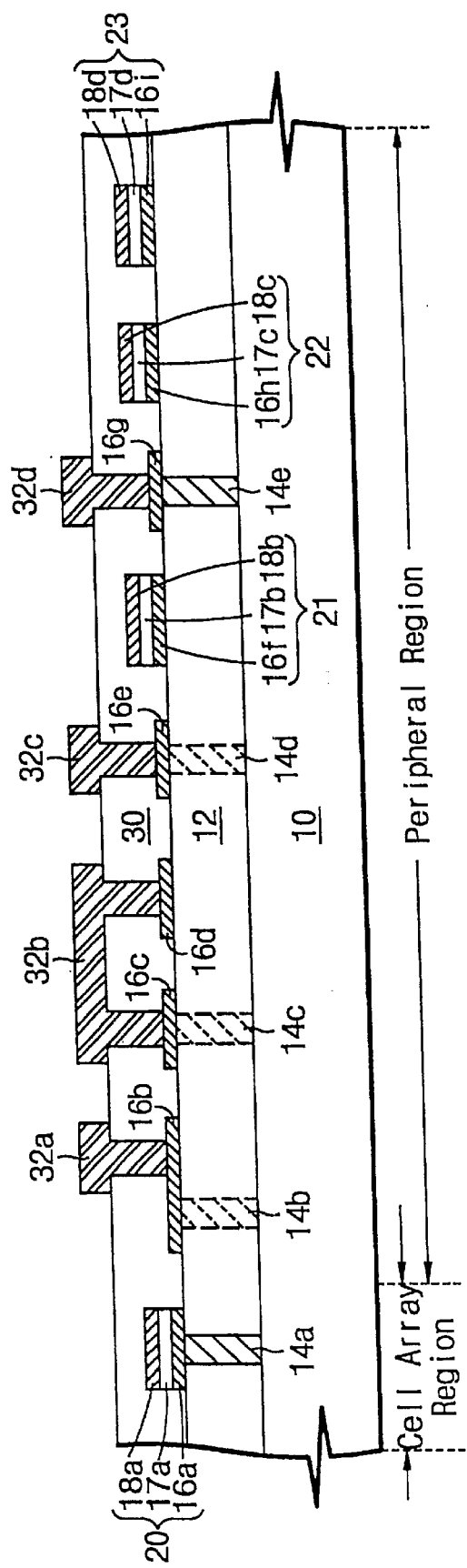

Referring now to FIG. 3, a second insulating layer 30 is formed on the substrate 10, for example by deposition. Selected portions of the second insulating layer 30 are patterned to form first openings that expose the lower electrode patterns 16b, 16c, 16d, 16e and 16g in the peripheral region. Patterning may take place by etching, for example using chemical-mechanical polishing. A first level interconnection 32a to 32d is completed by forming a conducive material in the first openings and on the second insulating layer 30 and then patterning thereof into a predetermined configuration. The first level interconnection preferably is made of the same material that was already used as the lower and upper electrode layers 16 and 18, respectively.

Figure 4:
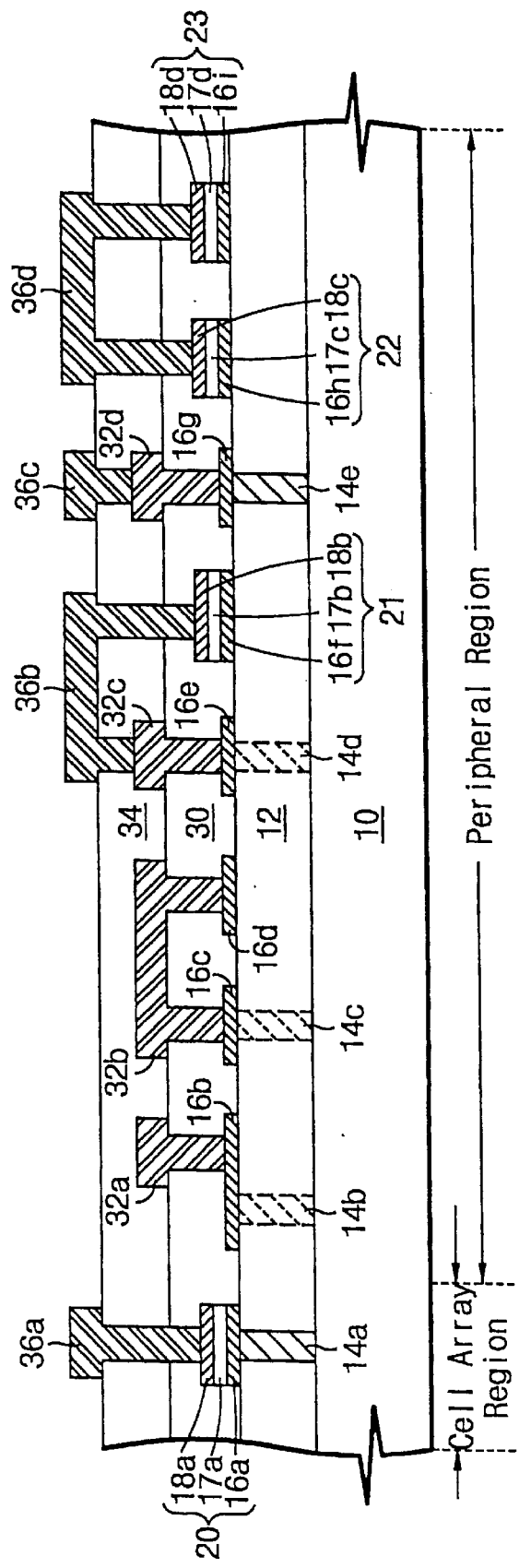

Referring now to FIG. 4, a third insulating layer 34 is formed on the first level interconnection and on the second insulating layer 30. Selected portions of the third insulating layer 34 and the second insulating layer 30 thereunder are etched to form second openings that expose the upper electrode pattern 18a of the ferroelectric capacitor 20 in the cell array region and expose some 32c and 32d of the first level interconnections 32a to 32d and the upper electrode patterns 18b to 18d of the capacitor patterns 21 to 23 in the peripheral region. A second level interconnection 36a to 36d is completed by forming conductive material in the second openings and on the third insulating layer 34 and then patterning thereof into a predetermined configuration. Patterning may take place by etching, for example using chemical-mechanical polishing. The second level interconnection preferably is made of the same material that was already used as the lower and upper electrode layers 16 and 18 respectively.

The resulting interconnection structure in the peripheral region is as follows: The lower electrode pattern 16b is electrically connected to the first level interconnection 32a. The lower electrode pattern 16b may be electrically connected to a source/drain region of a CMOS transistor through the contact plug 14b. The lower electrode patterns 16c and 16d are electrically connected to each other through the first level interconnection 32b. One of the lower electrode patterns 16a and 16c may be electrically connected to the source/drain region of a CMOS transistor.

The lower electrode pattern 16e is electrically connected to the upper electrode pattern 18b of the pseudo-capacitor 21. In particular, the lower electrode pattern 16e is connected to the first level interconnection 32c and the first level interconnection 32c is electrically connected to the upper electrode pattern 18b through the second level interconnection 36b. The lower electrode pattern 16e may be electrically connected to the source/drain region of a CMOS transistor.

The lower electrode pattern 16g is electrically connected to a source/drain region of a CMOS transistor through the contact plug 14e, and also is electrically connected to the second level interconnection 36c through the first level interconnection 32d.

Adjacent pseudo-capacitors 22 and 23 are electrically connected to each other through the second level interconnection 36d. However, since these pseudo-capacitors 22 and 23 are not electrically connected to the source/drain regions of CMOS transistors, they do not function as a capacitor. In particular, adjacent upper electrode patterns 18c and 18d are electrically connected to each other through the second level interconnection 36d.

Accordingly, the aspect ratio of the contact openings can be reduced due to the presence of the pseudo-capacitors, thereby allowing improved step coverage of the interconnection. Also, the multi-level interconnection can be implemented using the same material as the capacitor electrodes, to thereby allow simplified fabrication.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A conductive interconnection for an integrated circuit device, comprising:
    a first insulating layer formed on a semiconductor substrate, the first insulating layer including therein a plurality of conductive plugs;
    a plurality of capacitors formed on the first insulating layer, each capacitor comprising a first portion of a first conductive layer, a portion of a capacitor dielectric film and a portion of a second conductive layer in this order, wherein at least a first of the plurality of capacitors is electrically connected to a conductive plug and at least a second of the plurality of capacitors is not electrically connected to a conductive plug;
    a plurality of first conductive layer patterns formed on the first insulating layer, the first conductive layer patterns comprising a second portion of the first conductive layer that is free of the capacitor dielectric film and the second conductive layer thereon;
    a second insulating layer formed on the first insulating layer including the plurality of capacitors and the plurality of first conductive patterns;
    a first level interconnection formed on the second insulating layer to be electrically contacted to the plurality of conductive patterns, and that selectively electrically interconnecting selected ones of the first conductive patterns to one another on the second insulating layer;
    a third insulating layer formed on the second insulating layer and on the first level interconnection; and
    a second level interconnection formed on the third insulating layer, that selectively electrically contacts the at least one of the first capacitors, that selectively electrically connects the first level interconnection and that selectively electrically interconnects selected ones of the at least a second of the plurality of capacitors to one another and to the first level interconnection.

2. The conductive interconnection according to claim 1, wherein the capacitor dielectric film is made of a ferroelectric material.

3. The conductive interconnection according to claim 1, further comprising: a plurality of first contact holes in the second insulating layer that underlie selected ones of second contact holes in the third insulating layer and that selectively expose at least one of the first and second capacitors.

4. The conductive interconnection according to claim 1:
    wherein the integrated circuit is an integrated circuit memory device including a cell array region and a peripheral region;
    wherein the at least a first of the plurality of capacitors is located in the cell array region and the at least a second of the plurality of capacitors is located in the peripheral region; and
    wherein the plurality of first conductive layer patterns is located in the peripheral region.

5. A conductive connection for an integrated circuit device, comprising:
    a first insulating layer on an integrated circuit substrate;
    a plurality of capacitors on the first insulating layer, each capacitor comprising a first portion of a first conductive layer, a portion of a capacitor dielectric film thereon and a portion of a second conductive layer thereon;
    a plurality of first conductive layer patterns on the first insulating layer, the first conductive layer patterns comprising a second portion of the first conductive layer that is free of the capacitor dielectric film and the second conductive layer thereon;
    a second insulating layer on the first insulating layer, on the plurality of capacitors and on the plurality of first conductive patterns, the second insulating layer including therein a plurality of first contact holes that selectively expose the plurality of first conductive layer patterns;
    a first level interconnection in the plurality of first contact holes and on the second insulating layer that electrically contacts the plurality of first conductive patterns;
    a third insulating layer on the second insulating layer and on the first level interconnection, the third insulating layer including therein a plurality of second contact holes that selectively expose the first level interconnection and selected ones of the plurality of capacitors; and
    a second level interconnection formed on the third insulating layer to be selectively electrically contacted to the at least one of the first capacitors and to be selectively electrically contacted to the first level interconnection.

6. The conductive interconnection according to claim 5, wherein the capacitor dielectric film is made of a ferroelectric material.

7. A conductive connection for an integrated circuit device, comprising:
   a first insulating layer including therein a plurality of first conductive plugs on a semiconductor substrate;
   a plurality of capacitors on the first insulating layer, each capacitor comprising a portion of a first conductive layer, a portion of a capacitor dielectric film thereon and a portion of a second conductive layer thereon, wherein at least a first of the plurality of capacitors is electrically connected to a first conductive plug and at least a second of the plurality of capacitors is not electrically connected to a first conductive plug;
   a second insulating layer on the first insulating layer and on the plurality of capacitors, the second insulating layer including therein a plurality of contact holes that expose the at least a first and a second of the plurality of capacitors; and
   a plurality of second conductive plugs in the plurality of contact holes.

8. The conductive connection according to claim 7, wherein the capacitor dielectric film is made of a ferroelectric material.

9. The conductive connection according to claim 8, wherein the integrated circuit comprising a semiconductor memory device including a cell array region and a peripheral region,
   wherein the at least a first of the plurality of capacitors is located in the cell array region and the at least a second plurality of capacitors is located in the peripheral region.

* * * * *